(12) United States Patent
Nawrocki et al.

(10) Patent No.: US 8,313,173 B2
(45) Date of Patent: Nov. 20, 2012

(54) COMPOSITIONS AND PROCESSES FOR MANUFACTURING PRINTED ELECTRONICS

(75) Inventors: Daniel J. Nawrocki, Chicopee, MA (US); Jeremy V. Golden, Burlington, MA (US)

(73) Assignee: MicroChem Corp., Newton, MA (US)

( * ) Notice: Subject to any disclaimer, the term of this patent is extended or adjusted under 35 U.S.C. 154(b) by 0 days.

(21) Appl. No.: 13/068,245

(22) Filed: May 6, 2011

(65) Prior Publication Data
US 2011/0267409 A1 Nov. 3, 2011

Related U.S. Application Data

(62) Division of application No. 12/283,724, filed on Sep. 15, 2008.

(60) Provisional application No. 60/994,850, filed on Sep. 21, 2007.

(51) Int. Cl.
B41J 2/015 (2006.01)
B41J 2/01 (2006.01)
C09D 11/10 (2006.01)

(52) U.S. Cl. .... 347/68; 347/102; 106/31.57; 106/31.58; 106/31.85; 106/31.86

(58) Field of Classification Search .............. 106/31.13, 106/31.27, 31.57, 31.58, 31.6, 31.85, 31.86, 106/31.88; 523/454, 456, 463, 464; 524/765, 524/766, 768, 770, 771; 347/68, 102
See application file for complete search history.

(56) References Cited

U.S. PATENT DOCUMENTS

| | | |
|---|---|---|
| 3,975,201 A | 8/1976 | Greenstein |
| 5,714,284 A | 2/1998 | Hirsh et al. |
| 6,180,315 B1 | 1/2001 | Schadeli et al. |
| 2004/0236006 A1 | 11/2004 | Tanaka et al. |
| 2007/0134575 A1 | 6/2007 | Duff et al. |
| 2007/0160776 A1 | 7/2007 | Kwon et al. |
| 2007/0207565 A1 | 9/2007 | Kodas et al. |

FOREIGN PATENT DOCUMENTS

| | | |
|---|---|---|
| EP | 1016698 | 7/2000 |
| JP | 06148888 A | 5/1994 |
| WO | WO 95/10073 | 4/1995 |

OTHER PUBLICATIONS

Encyclopedia of Materials, Science and Technology; vol. 10 T-Z; Eisevier Science Ltd.; 2001; "Thermosets: Phenolics, Novolacs, and Benzoxazine"; pp. 9226-9229.
Machine translation of JP 06148888 A, provided by the JPO website (no date).
Product and Application Guide for: Cymel Amino resin Crosslinkers for the Coating Industry (2008).
Product Brochure for: Cymel Resins (2010).
Technical Data Specifications for Powderlink 1174 (no date).
Product Guide for Propylene Glycol Monoethyl Ether (2011).
Product Guide for 1-Methoxy-2-Propanol (2011).

*Primary Examiner* — Michael J Feely
(74) *Attorney, Agent, or Firm* — Todd E. Garabedian; Wiggin and Dana LLP

(57) ABSTRACT

The present invention is directed to a printable composition, comprising: 0.5 to 60 wt % of a polymer selected from the group consisting of epoxy, Novolac and poly(dimethylglutarimide); and 40-99.5 wt % of a solvent composition comprising (1) a high boiling point solvent having a flash point greater than about 10° C. and a boiling point greater than about 130° C. and (2) a low boiling point solvent having a flash point less than 30° C. and a boiling point less than or equal to 130° C., all weight percents based on the total weight of the composition. The present invention is also directed to methods of forming patterned substrates using the above compositions. The compositions of the invention are useful for printing electronic materials onto a substrate using a piezo-electric printer.

20 Claims, 9 Drawing Sheets

1. Inkjet printing on (a) to give pattern (b)
2. Photoexpose with or without stencil and develop (c)
3. Final photo-trimmed pattern (d)

COMPOSITIONS AND PROCESSES FOR MANUFACTURING PRINTED ELECTRONICS

CROSS-REFERENCE TO RELATED APPLICATIONS

This application is a Divisional of U.S. patent application Ser. No. 12/283,724 filed Sep. 15, 2008 which claims the benefit of U.S. Provisional Patent Application Ser. No. 60/994,850 filed Sep. 21, 2007.

BACKGROUND OF THE INVENTION

1. Field of the Invention

The present invention relates to compositions and processes for manufacturing printed electronics, and more particularly to compositions and methods for printing electronic materials onto a substrate using a piezo-electric printer.

2. Brief Description of the Art

The implementation of cost-effective consumer electronic device manufacture has led to the investigation of new IC and PC patterning processes. Photolithography, the mainstay of IC manufacturing for the past 30 years, has been challenged recently by the need for more forgiving patterning environments, such as for manufacture of flat panel and flexible displays, LED displays, electronic paper, optoelectronics, photovoltaics, microelectronic mechanical systems (MEMS), and the like. Novel patterning techniques, such as MicroStamping, NanoImprint, and Inkjet patterning, have received much focused attention. In recent years, improvements in inkjet dispensing, specifically derived from decrease in inkjet drop size, have vaulted this technology into the forefront of methodologies employed for high volume consumer electronic device manufacture, primarily for color filters and addressable ICs used in large format flat panel displays. The result has been development of ink-jet fabrication architectures collectively known as printed electronics.

Currently available polymeric blends for use in conventional photolithographic device manufacturing are designed primarily to dry by spinning in a process known as film casting, and are adjusted to have specific viscosity and surface tension parameters that are compatible with these techniques. However, these materials are not compatible with ink-jet devices. The properties of the materials, particularly the viscosity, surface tension, and evaporation rate, cause clogging of the nozzles used to apply the material to substrates. What is needed in the art are materials that can be implemented with ink jet printers so that device manufacturers can take full advantage of the newly developed printed electronics techniques. This invention is believed to be a solution to that need.

SUMMARY OF THE INVENTION

In one aspect, the present invention is directed to a printable composition, comprising: 0.5 to 60 wt % of a polymer selected from the group consisting of epoxy, Novolac and poly(dimethylglutarimide); and 40-99.5 wt % of a solvent composition comprising (1) a high boiling point solvent having a flash point greater than about 10° C. and a boiling point greater than about 130° C. and (2) a low boiling point solvent having a flash point less than 30° C. and a boiling point less than or equal to 130° C., all weight percents based on the total weight of the composition.

In another aspect, the present invention is directed to a method of producing a printed pattern on a substrate, comprising the steps of: (1) applying the printable composition above to a substrate using a piezo-electric printing device; (2) drying the applied composition; and (3) optionally curing the dried composition to produce a printed pattern on a substrate.

These and other aspects will become apparent upon reading the following detailed description of the invention.

BRIEF DESCRIPTION OF THE FIGURES

The following description of the invention will be better understood when taken in conjunction with the following figures in which.

DETAILED DESCRIPTION OF THE INVENTION

Figure 1:
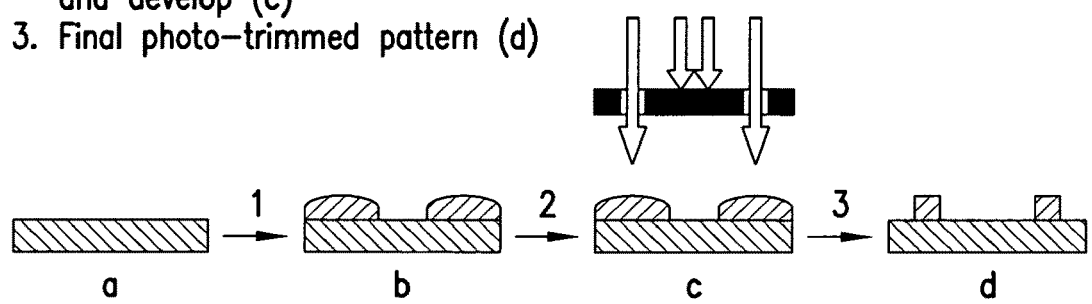
FIG. 1 depicts a schematic that demonstrates the process for negative (crosslinking) tone.
Figure 2:
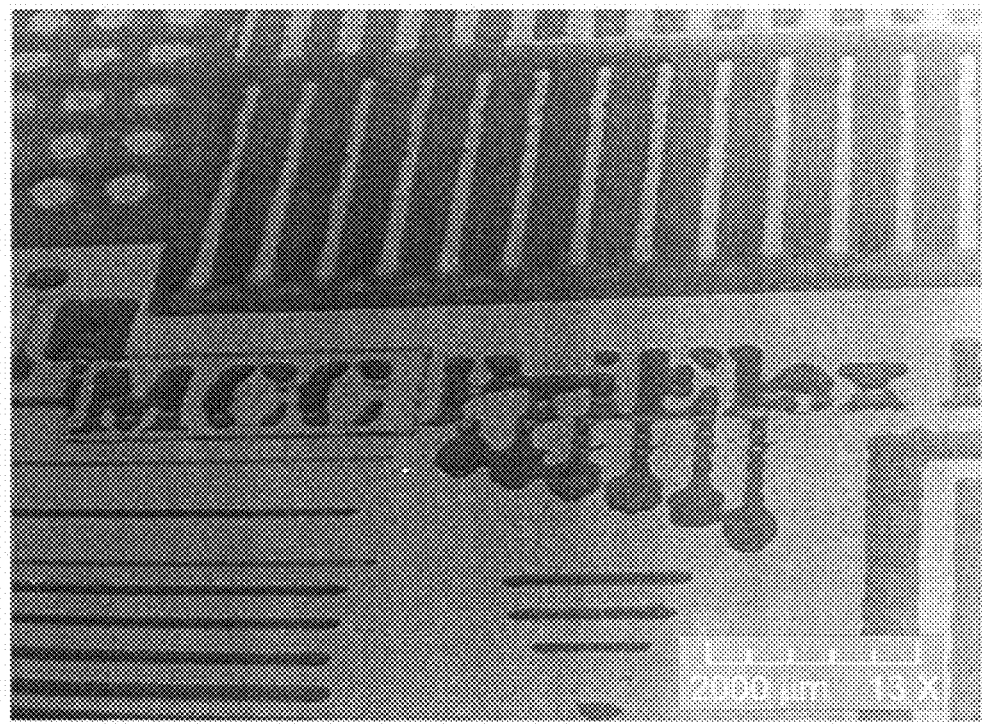
FIG. 2 depicts patterns made from an epoxy-based composition of the present invention.
Figure 3:
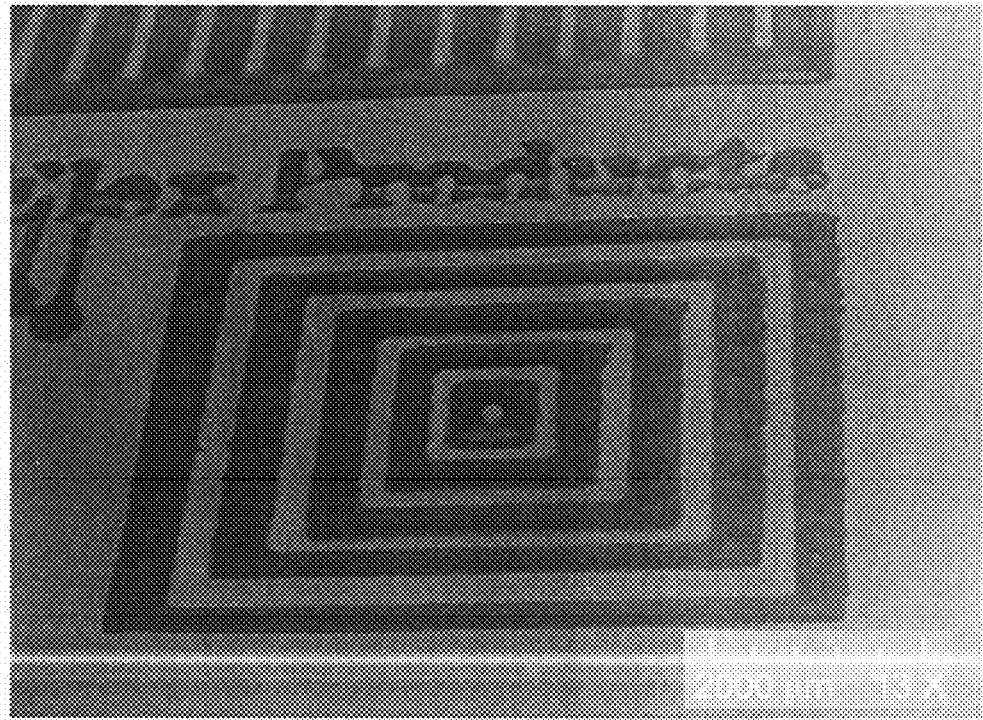
FIG. 3 depicts further patterns made from an epoxy-based composition of the present invention.
Figure 4:
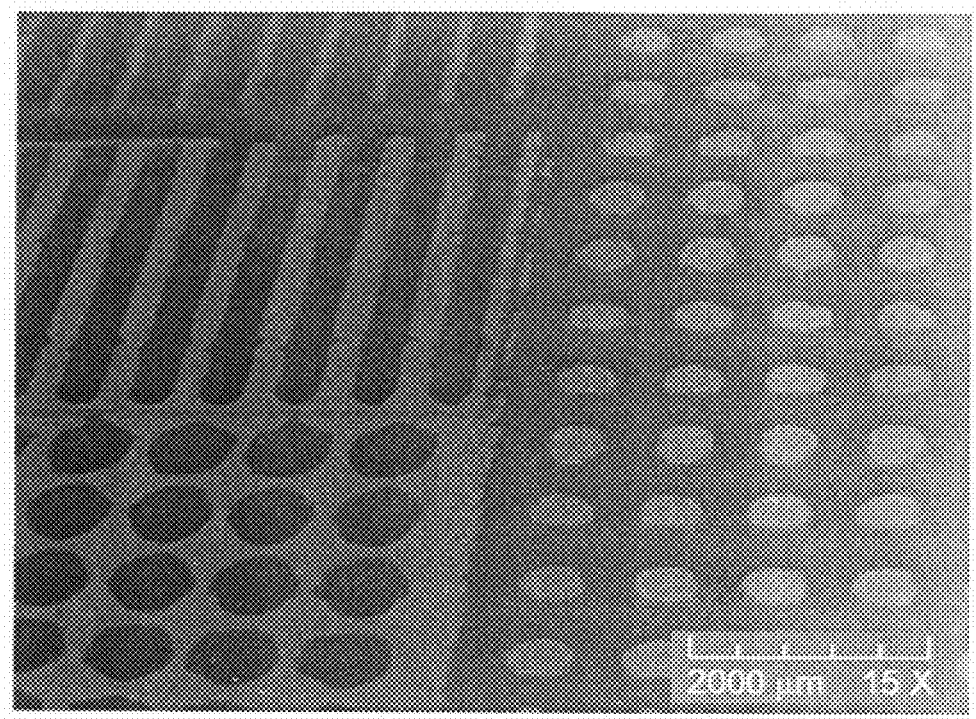
FIG. 4 depicts further patterns made from an epoxy-based composition of the present invention.

The present invention includes compositions of materials for use in device manufacturing using ink-jet (piezo-electric) based patterning techniques, collectively known as "printed electronics". The formulations of the present invention overcome disadvantages present when currently available materials for use in conventional photolithographic processes are utilized in piezo-electric based patterning techniques, particularly clogging of print nozzles. The inventors have found that epoxy, Novolac, and poly(dimethylglutarimide) (PMGI) based compositions can be made for inkjet compatibility, and can be UV or thermally cured. The compositions of the present invention can be used in lift-off techniques to reduce critical dimensions in devices, and can be modified for absorbance and conductivity for a wide variety of applications.

In general, the compositions of the present invention are comprised of polymeric blends including, but not limited to, epoxy (e.g., SU-8) resins, Novolac resins, and PMGI materials, solvents, and optional functional additives, that are specifically designed for use with piezo-electric printers. The compositions of the present invention overcome a variety of problems associated with traditional coating methods. The compositions of the invention eliminate the need for spin coating and the defects associated with it. Spin coating by nature can cause a variety of defects such as incomplete coverage over topography, film variations due to evaporation variations, and variable kinetic effects across the radius of a substrate, and the like. The compositions of the present invention can help eliminate this process step.

The compositions of the present invention also allow coating on a wide variety of surfaces, including flexible substrates. Spin coating can only generally coat hard surfaces than can be spun fast.

The compositions of the present invention are also cost-effective, in that they greatly reduce the volume of chemicals used and reduce the levels of hazardous waste generated, versus other coating methods: spin coat, roller coat, and spray coat.

The compositions of the present invention promote contamination reduction, by printing only where necessary on the device. This surgical-like precision provides an advantage over other coating methods that do not selectively coat specific areas on a substrate.

The compositions of the present invention provide versatility with thermal or UV cure to eliminate process steps in conventional coating methods.

The compositions of the present invention also provide avenues for pattern resolution improvements for increased precision of the final products. In one embodiment, the compositions of the present invention can be used in a process called Photo-Trimming. Photo-trimming is the process of using photolithography aligned over ink jet printed features to improve edge acuity and/or produce very high resolution features, with all the volume-dispense and print selectivity advantages of inkjet printing. Photo-trimming can be used in multiple layers to produce lift-off profiles. Lift-off profiles can also be generated without photo-trimming. Both of these methods are shown in more detail below.

As indicated above, the present invention is directed to a printable composition, comprising: 0.5 to 60 wt % of a polymer selected from the group consisting of epoxy, Novolac and poly(dimethylglutarimide); and 40-99.5 wt % of a solvent composition comprising (1) a high boiling point solvent having a flash point greater than about 10° C. and a boiling point greater than about 130° C. and (2) a low boiling point solvent having a flash point less than 30° C. and a boiling point less than or equal to 130° C., all weight percents based on the total weight of said composition. Each of these components are described in more detail below.

The first component of the printable composition of the invention is polymer such as epoxy resins (e.g., SU-8), Novolac resins, or poly(dimethylglutarimide) (PMGI), which are known in the art. Combinations of these polymers may also be used if desired. The amount of polymer in the composition of the invention generally ranges from 0.5 to 60 wt %, based on the total weight of the composition. In more preferred embodiments, 0.5 to 15 wt % of PMGI, and more preferably 5 to 12 wt % of PMGI, based on the total weight of the compositions is used. In other preferred embodiments, 0.5 to 40 wt % of Novolac or epoxy resin, and more preferably 10 to 35 wt % of Novolac or epoxy resin, based on the total weight of the composition is used. Preferably, the Novolac polymer has a molecular weight of 50,000 Daltons or less, the epoxy polymer has a molecular weight of 20,000 Daltons or less, and the PMGI polymer has a molecular weight of 90,000 Daltons or less.

The solvent used in the printable composition of the invention comprises from 40 to 99.5% by weight of the composition, and is a solvent composition comprising at least one high boiling point solvent and at least one low boiling point solvent. The high boiling point solvent has a flash point greater than about 10° C. and a boiling point greater than about 130° C. Examples of useful high boiling point solvents include gamma butyrolactone, ethyl lactate, methyl 2-hydroxyisobutyrate, PGMEA, cyclohexanone, tetrahydrofurfuryl alcohol, propylene carbonate, 2-heptanone, NMP, diacetone alcohol, and combinations thereof. The low boiling point solvent has a flash point less than 30° C. and a boiling point less than or equal to 130° C. Examples of useful low boiling point solvents include methyl isobutyl ketone, cyclopentanone, 1,3 dioxolane, tetrahydrofuran (THF), methyl isopropyl ketone, 2-pentanone, pinacolone, propylene glycol monomethyl ether, propylene glycol monoethyl ether, methyl ethyl ketone (MEK), toluene, and combinations thereof.

When the polymer is PMGI, the amount of solvent in the printable composition of the invention preferably ranges from 85 to 99.5 wt %, based on the total weight of said composition, and more preferably from 88 to 95 wt %, based on the total weight of said composition. When the polymer is Novolac or epoxy, the amount of solvent in the printable composition of the invention preferably ranges from 60 to 99.5 wt %, based on the total weight of said composition, and more preferably from 65 to 90 wt %, based on the total weight of said composition. As will be understood by one of skill in the art, the solvent in the printable composition may include more than two components, for example three, four, five, or more solvents.

The solvents that are part of the printable composition of the invention are included in a ratio optimized for the particular substrate and polymeric composition. The solvent ratio is optimized to form homogenous films depending on the contact angle of the substrate. It is further optimized by solvency of the solids system. The components in the solvent system will have varied evaporation rate (vapor pressure) for this optimization. Preferably, the solvent mixture is optimized for desired drying & surface tension conditions. In general, low boiling solvents are compatible up to 50% of the total solvent composition when used with a polymer that has a molecular weight<15,000. High boiling solvents can be formulated with a range of 0.5 to 99.5% of total solvent, regardless of molecular weight, but there is a trade off with drying time.

Surface tension and viscosity of the compositions of the invention are preferably optimized for use in piezo-electric printing equipment. Surface tension of the composition preferably ranges from about 28 to about 33 dynes/cm$^2$, and viscosity is preferably in the range of about 10-12 cPs at the printer operating temperature.

The printable composition of the invention may also optionally include a crosslinker. Preferably, the crosslinker is an amine compound such as melamine or melamine resins. Examples of commercially available melamines include Cymel 300, 301, 303, 350, 370, 380 (methylated melamine crosslinkers), 1116, or 1130 (alkylated mixed ether melanie crosslinkers). Glycourils are also useful and are particularly preferred. An example of a particularly useful glycouril is Powderlink 1174 tetrakis(methoxymerhyl)glycoluril). Benzoquanamines, such as Cymel 1123 (alkylated mixed ether benzoguanamine crosslinkers) or 1125 (alkylated mixed ether carboxylated benzoguanamine crosslinkers) are also useful crosslinkers. The amount of crosslinker included in the printable composition of the invention ranges from 0 to 15 wt %, based on the total weight of said composition, more preferably from 0 to 10 wt %, based on the total weight of said composition, and most preferably from 2.5 to 9 wt %, based on the total weight of said composition.

The printable composition of the invention may also optionally include an acid generator. The acid generator may be activated by light (e.g., a photo-acid generator or PAG) or by heat (e.g., a thermal-acid generator or TAG) to enhance either thermal or photochemical cure using temperature or UV light, respectively. Onium salts may be employed as photoacid generators of ink jet compositions of the invention. Onium salts that are weakly nucleophilic anions have been found to be particularly suitable. Examples of such anions are the halogen complex anions of divalent to heptavalent metals or non-metals, for example, Sb, Sn, Fe, Bi, Al, Ga, In, Ti, Zr, Sc, D, Cr, Hf, and Cu as well as B, P, and As. Examples of suitable onium salts are diaryl-diazonium salts and onium salts of group Va and B, Ia and B and I of the Periodic Table, for example, halonium salts, quaternary ammonium, phosphonium and arsonium salts, aromatic sulfonium salts and sulfoxonium salts or selenium salts. Examples of suitable preferred onium salts can be found in U.S. Pat. Nos. 6,190,839; 4,442,197; 4,603,101; and 4,624,912. Substituted diphenyl iodonium camphor sulfonate compounds are preferred onium PAGs for antireflective compositions of the invention, particularly sulfonate salts. Other suitable PAGs including sulfonated esters and sulfonyloxy ketones may also be used. See J. Photopolymer Science and Technology, 4(3):337-340 (1991), for disclosure of suitable sulfonate PAGS, including benzoin tosylate, t-butylphenyl alpha-(p-toluenesulfonyloxy)-acetate and t-butyl alpha-(p-toluenesulfonyloxy)-acetate. Preferred sulfonate PAGs are also disclosed in U.S. Pat. No. 5,344,742 to Sinta et al.

Other useful acid generators nitrobenzyl esters, and the s-triazine derivatives. Suitable s-triazine acid generators are disclosed, for example, in U.S. Pat. No. 4,189,323. Halogenated non-ionic, photoacid generating compounds also may be suitable such as, for example, 1,1-bis[p-chlorophenyl]-2,2,2-trichloroethane (DDT); 1,1-bis[p-methoxyphenyl]-2,2,2-trichloroethane; 1,2,5,6,9,10-hexabromocyclodecane; 1,10-dibromodecane; 1,1-bis[p-chlorophenyl]-2,2-dichloroethane; 4,4-dichloro-2-(trichloromethyl) benzhydrol (Kelthane); hexachlorodimethyl sulfone; 2-chloro-6-(trichloromethyl) pyridine; o,o-diethyl-o-(3,5,6-trichloro-2-pyridyl) phosphorothionate; 1,2,3,4,5,6-hexachlorocyclohexane; N(1,1-bis[p-chlorophenyl]-2,2,2-trichloroethyl)acetamide; tris[2,3-dibromopropyl]isocyanurate; 2,2-bis[p-chlorophenyl]-1,1-dichloroethylene; tris[trichloromethyl]s-triazine; and their isomers, analogs, homologs, and residual compounds. Suitable photoacid generators are also disclosed in European Patent Application Nos. 0164248 and 0232972.

A variety of known thermal acid generators (TAGs) are suitably employed in the composition of the invention, such as CXC 1612, 2,4,4,6-tetrabromocyclohexadienone, benzoin tosylate, 2-nitrobenzyl tosylate, and other alkyl esters of organic sulfonic acids. Compounds that generate a sulfonic acid upon activation are generally suitable. Also, rather than a thermal acid generator, an acid may be simply formulated into the composition, particularly for antireflective compositions that require heating to cure in the presence of acid so that the acid does not promote undesired reaction of composition components prior to use of the composition. Suitable acids include e.g. strong acids such as sulfonic acids such as toluene sulfonic acid and sulfonic acid, triflic acid, or mixtures of those materials.

The amount of acid generator used in the composition of the invention preferably ranges from 0 to 6 wt %, based on the total weight of said composition, more preferably from 0 to 4 wt %, based on the total weight of said composition, and most preferably from 0 to 3 wt %, based on the total weight of said composition.

Additional ingredients such as dyes, plasticizers, flexibilizers, surface leveling agents, surface wetting agents, and combinations thereof, may also be included in the composition of the invention. These additional ingredients are useful to change flow dynamics on different substrates. Further additional ingredients that may be included in the composition of the invention include engineered nanoparticles or nanoparticulate composite materials, which directly change the functional properties of the inkjet deposited films beyond those improvements provided by the structural components of the original formulation. Physical properties of the composition that are advantageously altered by the inclusion of nanoparticles and/or composite nanoparticle materials include, but are not limited to, improving film conductivity, increasing bulk film dielectric constant, film resistivity, film thermal resistance, modulation of bulk film refractive index, bulk film mechanical properties, and modulation of bulk film biological activity. Preferably, the amounts of such additional ingredients are added up to about 30% by weight, based on the total weight of the composition. In preferred embodiments, the nanoparticles and/or composite nanoparticle materials are included in the composition of the invention in amounts ranging from about 0.1 wt % to about 10 wt %, based on the total weight of the composition.

The compositions of the invention may be made using the following procedure:

(1) Dissolve the selected polymer in the solvent system in a low shear mix environment by rolling (50-250 rpm) or using low shear mixers (<1000 rpm). Solution may be heated to assist in polymer dissolution into solvent. Mix until polymer is completely dissolved. Examples of typical mix conditions are as follows:

Epoxy—roll for 4 hrs at 100 rpm at 50 degrees C.
PMGI—roll for 8 hrs at 100 rpm at 80 degrees C.
Novolac—roll for 8 hrs at 100 rpm at 50 degrees C.

Components that are not affected by heat in the mix can be added with the polymer to the mix during dissolution in this step. These typically can include: plasticizers, flexibilizers, surfactants, and some PAGs (2) After dissolution, cool the mix to room temperature and add heat sensitive components in a low shear mix environment by rolling (50-250 rpm) or using low shear mixers (<1000 rpm). Mix until completely dissolved. Components added at this time are TAGs, crosslinkers, dyes and heat sensitive PAGs.

(3) Filtration of the solution. The filtration scheme may be varied to suit different manufacturability—a basic scheme is presented as follows:

The solution is pre-filtered through a polypropylene, Teflon or nylon membrane to remove gross particulate matter. The filtration media will depend on the formulary composition. The pore size varies from about 0.01 to about 5 microns depending on the total solids content of the solution. The solution is final filtered using the same media through a pore size from about 0.01 to about 0.2 microns depending on the total solids content of the solution. One skilled in the art would recognize that other pore sizes are also possible for use in this step.

To utilize the above compositions in a piezo-electric printer, the following steps are used:

A piezo-electric printer cartridge, e.g., a Dimatix material cartridge model # DMC-11610, is filled by carefully inserting into the fill port the needle from a syringe filled with approximately 1.5 ml of the composition. The material is slowly injected, filling the fluid module. The pressure port of the fluid module and the opening of the jetting modules are aligned and snapped together. The filled cartridge is then allowed to sit for 30 min to allow any entrapped air to settle away from the nozzles.

The proper waveform for the solution is selected, and the proper voltage settings for each print head are also selected to achieve the optimal drop velocity for the specific ink composition upon jetting.

The substrates to be deposited onto vary by the required application, but can include typical semiconductor substrates of Si, GaAs and other III-IV and III-V metals, glass. Flexible substrates can include various plastics such as PET, PETG, Kapton and Mylar. These flexible substrates and standard semiconductor substrates such as Si may be additionally coated with various metals such as Au, Cu, Ag, or various oxide compounds such as ITO, antimony tin oxide, and $TiO_2$.

Following deposition of the polymer compositions, the coatings may be cured by air flow, thermally via a convection oven system or using hotplate, or by UV light exposure depending upon the composition and/or evaporation rate of the solvent system in the composition. UV cured inks may require an additional thermal bake to fully cure the system after the initial exposure. High temperature (>120° C.) curing will also in some cases increase the rate of cure or chemical resistance of the coating.

The printable composition of the invention may be dispensed in a variety of methods, such as ink-jet (piezo-electric) methods, including thermal and laser in-jet methods, stamping, screen coating, syringe dispensing, gravure coating, flexographic coating, and the like. The compositions of the invention are specifically designed for use with piezo-electric and/or thermal and/or laser ink jet printers In additional embodiments, substrates printed with compositions of the invention that include photoacid generators may be subjected to a process known as phototrimming. This process involves exposing the patterned substrate with UV light through a high resolution lithographic mask. Briefly, the photo-trimming process relies on the need to (1) improve pattern edge acuity for inkjet printed features and/or (2) the desire to pattern, selectively, high resolution features using already printed patterns. FIG. 1 shows a schematic that demonstrates the process for negative (crosslinking) tone.

The composition and methods of the present invention are useful in a variety of manufacturing processes including:

Compound Semiconductor manufacture: Lift-off in Transistors manufacture; PMGI can be used as a di-electric layer for passivation.

Lift-Off: Lift-off can be used for Controlled Metal deposition in compound semiconductor applications such as photovoltaics, VCELs, transistors.

Optical Electronics, such as manufacturing of LEDs: deposition of encapsulation/passivation layer; metal deposition in a lift-off process; creation of a background grating for light reflection.

Energy Devices: Enable manufacture processes in Battery & Fuel Cell applications Displays: DLP Displays—Deposition of epoxy as support structure MEMS: Sensors, actuators, resonators, microfluidic devices; PMGI can be used as a sacrificial layer support for use in 3D MEMS devices Printed Wire Boards and Printed Circuit Boards: Etch resistance for processes Passivation layer: Back-end Packaging of devices.

Photo-Trimming can be used to increase resolution for MEMS, Microfluidics, Nano-imprint and can be used to enhance any of the above applications.

EXAMPLES

The following examples are intended to illustrate, but in no way limit the scope of the present invention. All parts and percentages are by weight and all temperatures are in degrees Celsius unless explicitly stated otherwise.

Example 1

Epoxy-Based Composition 1

An epoxy (SU-8) composition was made by blending the following ingredients as outlined above.

| Component | Amount (wt %) |
|---|---|
| Epoxy SU-8 Resin | 27.8 |
| PAG (Cyracure) | 1.4 |
| Flexiblizer (Polyol 3315) | 3.25 |
| Surfactant (FluoroN) | 0.01 |
| Solvent 1 (γ-butyrolactone) | 3.375 |
| Solvent 2 (Methyl Isobutyl Ketone) | 64.125 |

The above ingredients were combined as described above, printed onto a silicon substrate, and cured as described above. Images from this composition were examined by electron microscopy and shown in FIGS. 1-4.

Example 2

Epoxy-Based Composition 2

A second epoxy (SU-8) composition was made by blending the following ingredients as outlined above. When used with the Dimatix DMP-2800 Series 16 piezo-print head printer, this composition produces thicker features for single pass by changing the solvent system

| Component | Amount (wt %) |
|---|---|
| Epoxy SU-8 Resin | 29.5 |
| PAG (Cyracure) | 1.48 |
| Surfactant (PF-151N) | 0.1 |
| Solvent 1 (γ-butyrolactone) | 6.9 |
| Solvent 2 (Cyclopentanone) | 62.1 |

Figure 5:
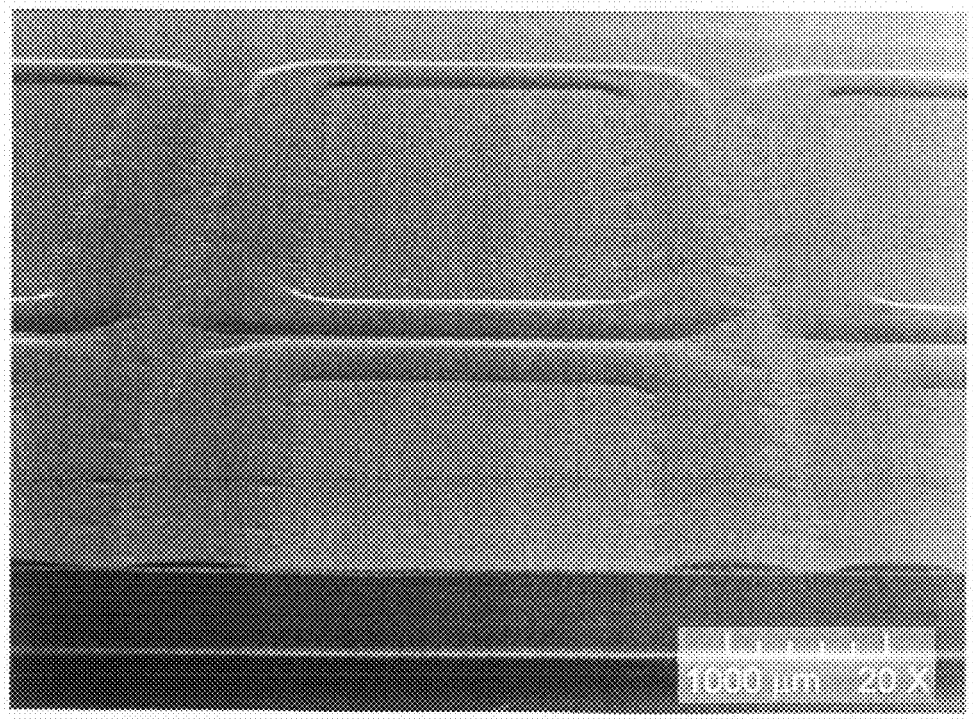
FIG. 5 depicts further patterns made from an epoxy-based composition of the present invention.
Figure 6:
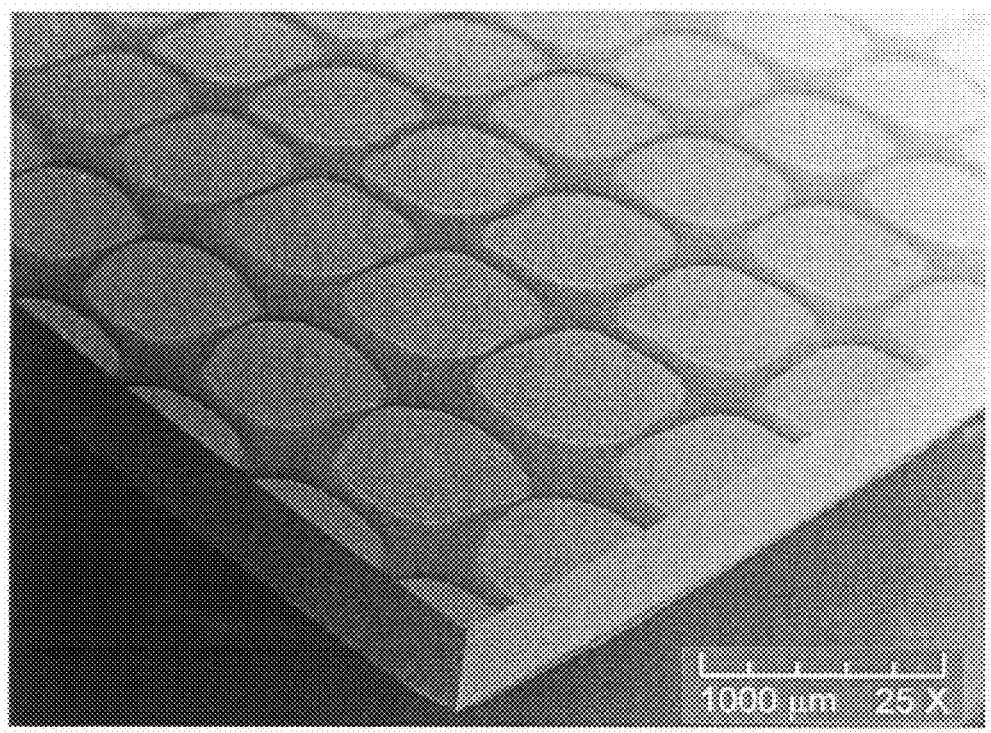
FIG. 6 depicts patterns made from another epoxy-based composition of the present invention.

The above ingredients were combined as described above, printed onto a silicon substrate, and cured as described above. Images from this composition were examined by electron microscopy and shown in FIGS. 5-6.

Example 3

Novolac Resin

A Novolac composition was made by blending the following ingredients as outlined above.

| Component | Amount (wt %) |
|---|---|
| Novolac Resin | 24.6 |
| Crosslinker (Powderlink 1174) | 4.67 |
| TAG (CXC 1612) | 0.31 |
| Flexibilizer (Polyol 3315) | 2.87 |
| Surfactant (FluoroN) | 0.025 |
| Solvent 1 (γ-butyrolactone) | 4.725 |
| Solvent 2 (Methyl Isobutyl Ketone) | 62.775 |

Figure 7:
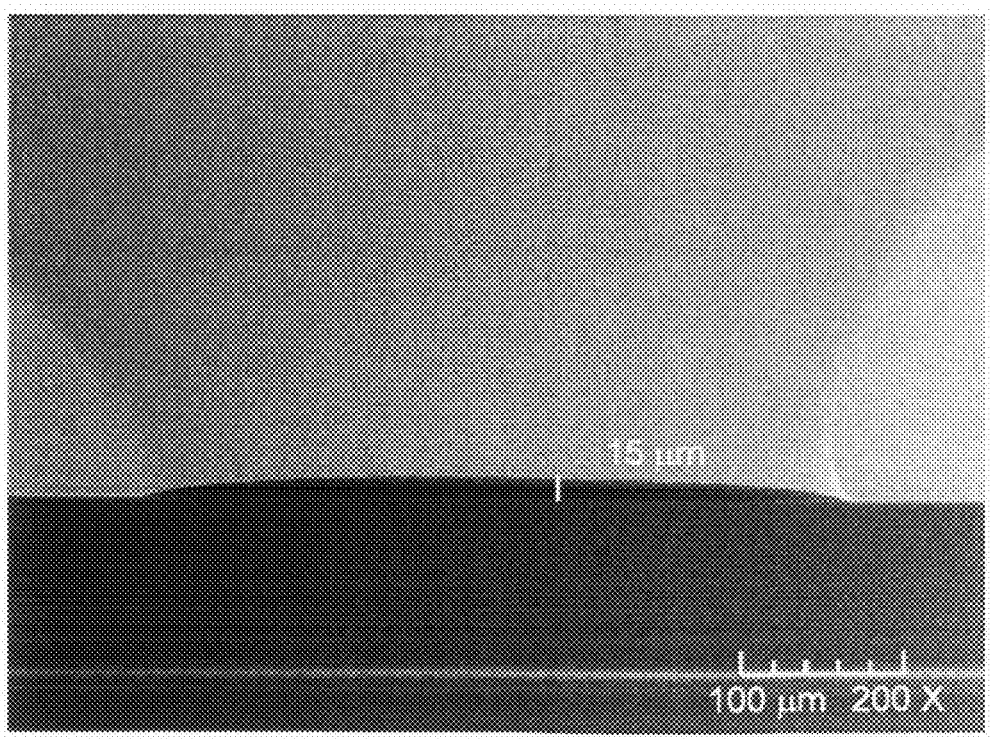
FIG. 7 depicts further patterns made from another epoxy-based composition of the present invention.
Figure 8:
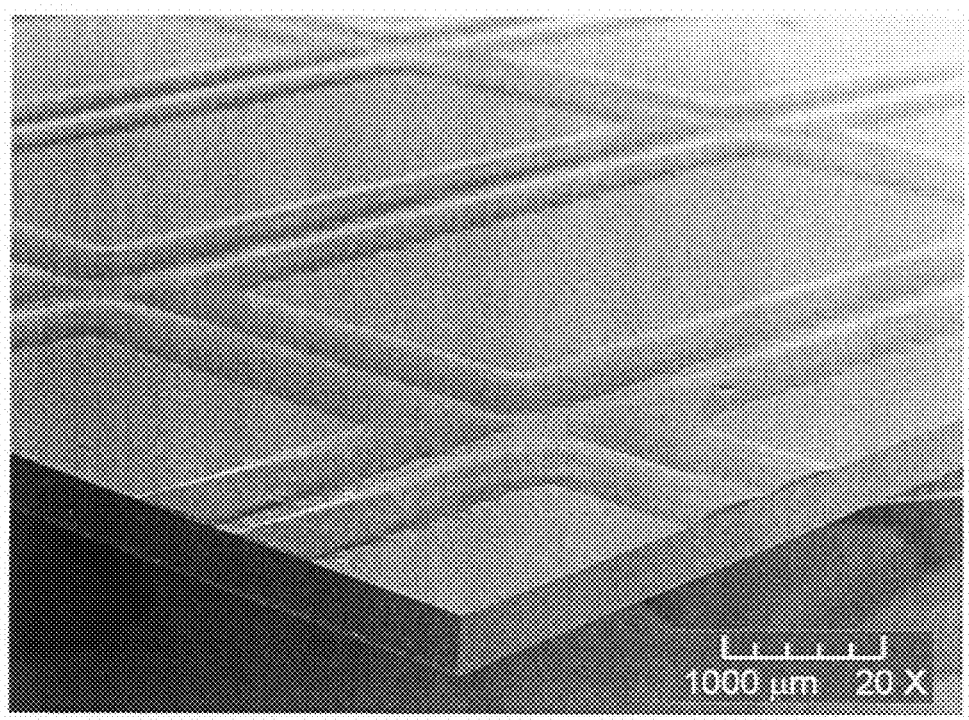
FIG. 8 depicts patterns made from a Novolac-based composition of the present invention.
Figure 9:
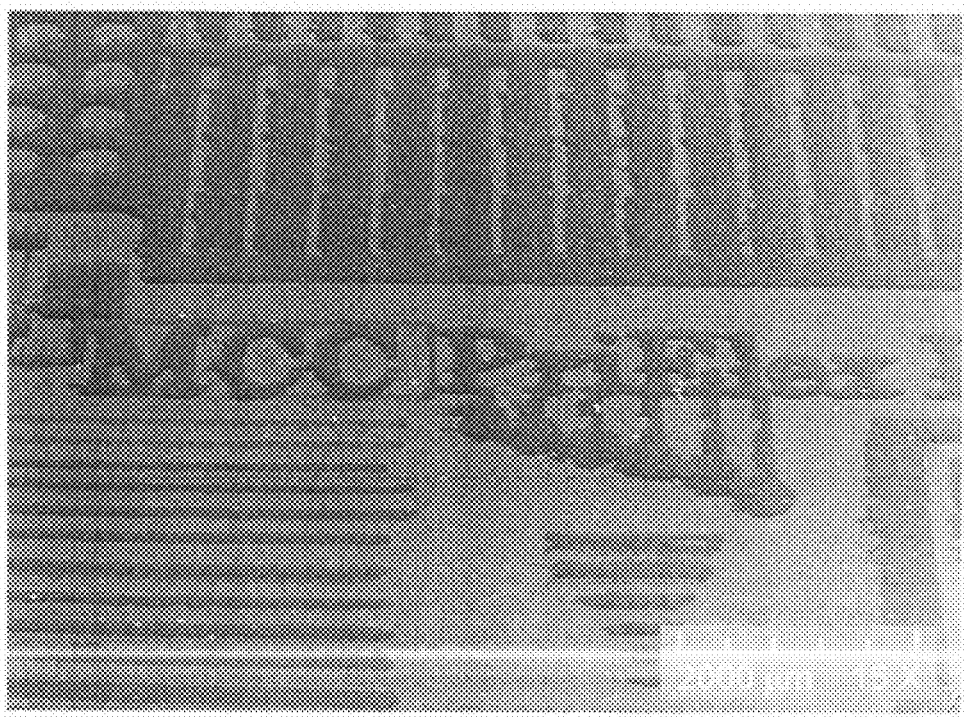
FIG. 9 depicts further patterns made from a Novolac-based composition of the present invention.
Figure 10:
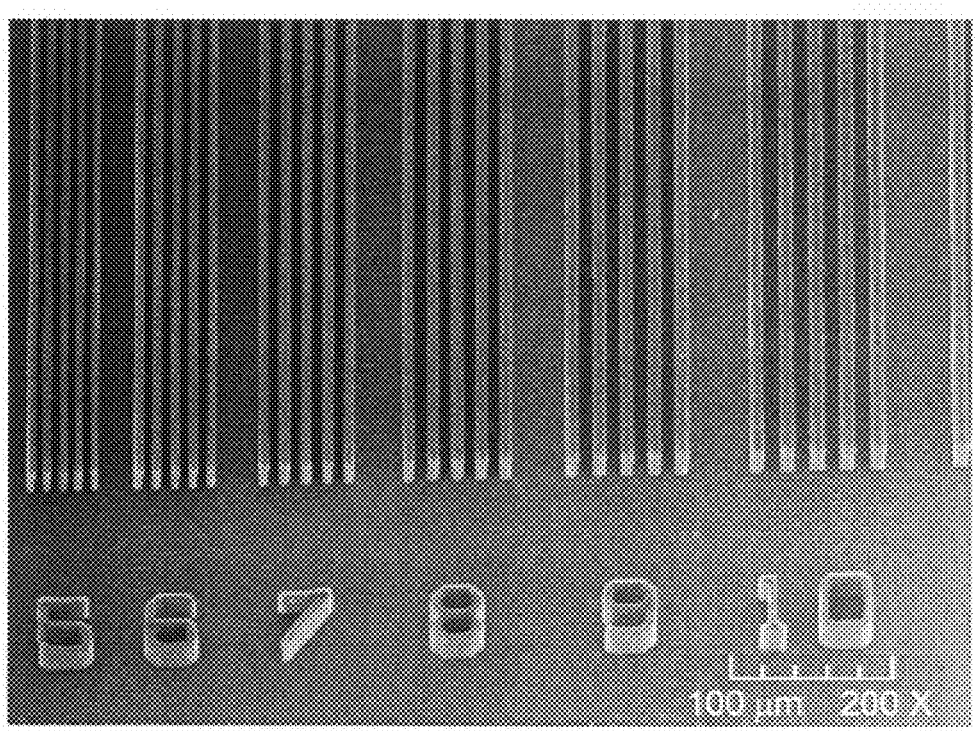
FIG. 10 depict phototrimmed patterns made from an epoxy-based composition of the present invention.
Figure 11:
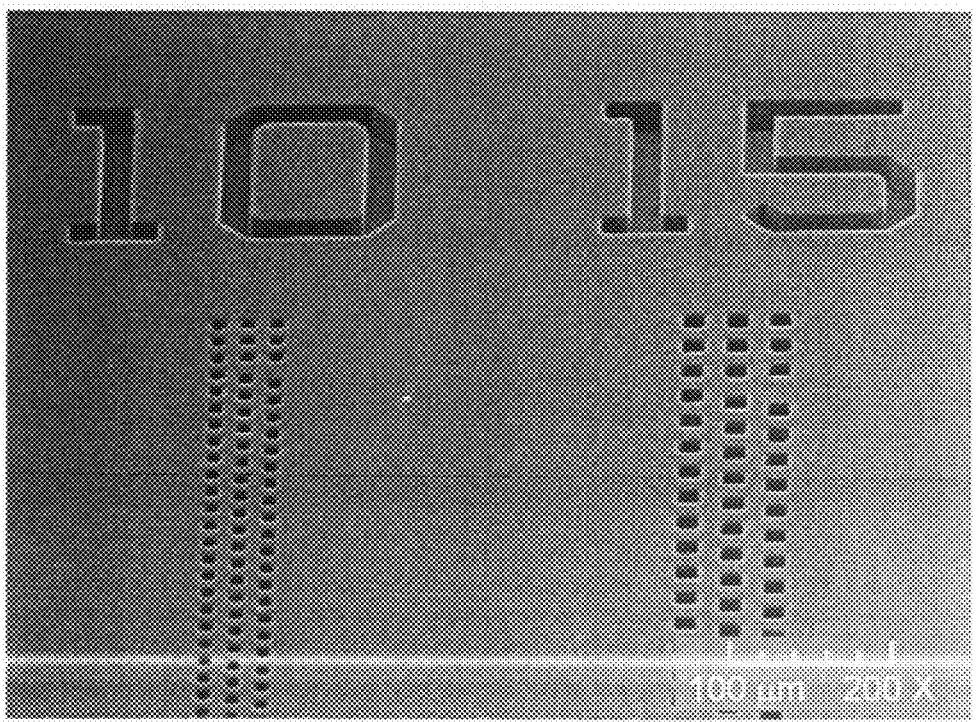
FIG. 11 depict further phototrimmed patterns made from an epoxy-based composition of the present invention.
Figure 12:
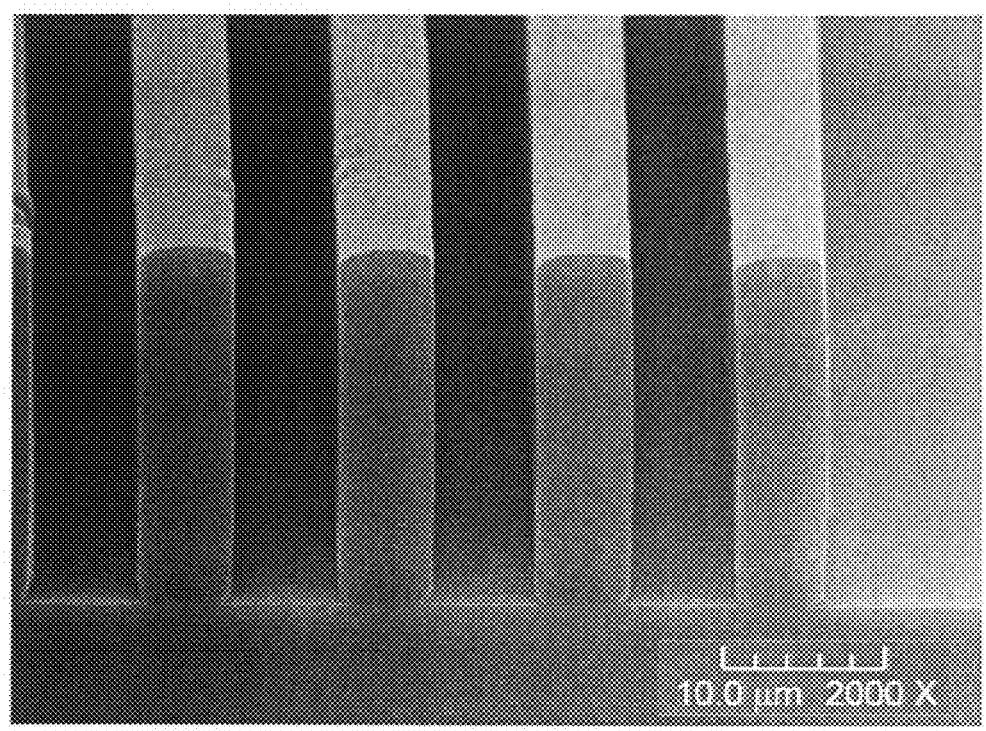
FIG. 12 depict further phototrimmed patterns made from an epoxy-based composition of the present invention.
Figure 13:
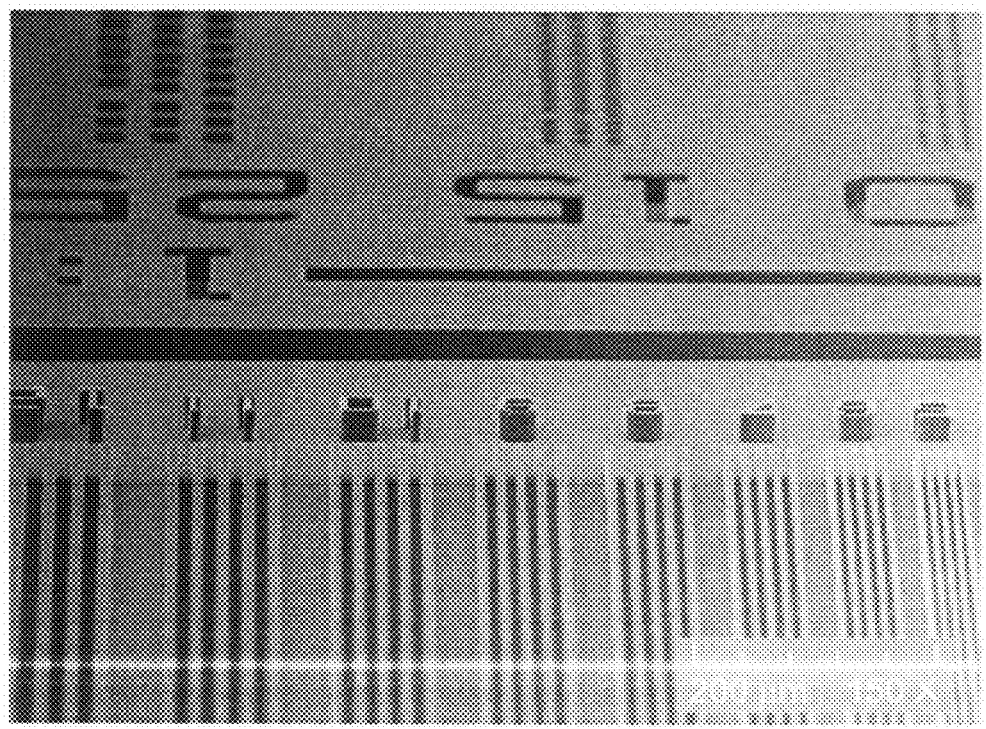
FIG. 13 depict further phototrimmed patterns made from an epoxy-based composition of the present invention.
Figure 14:
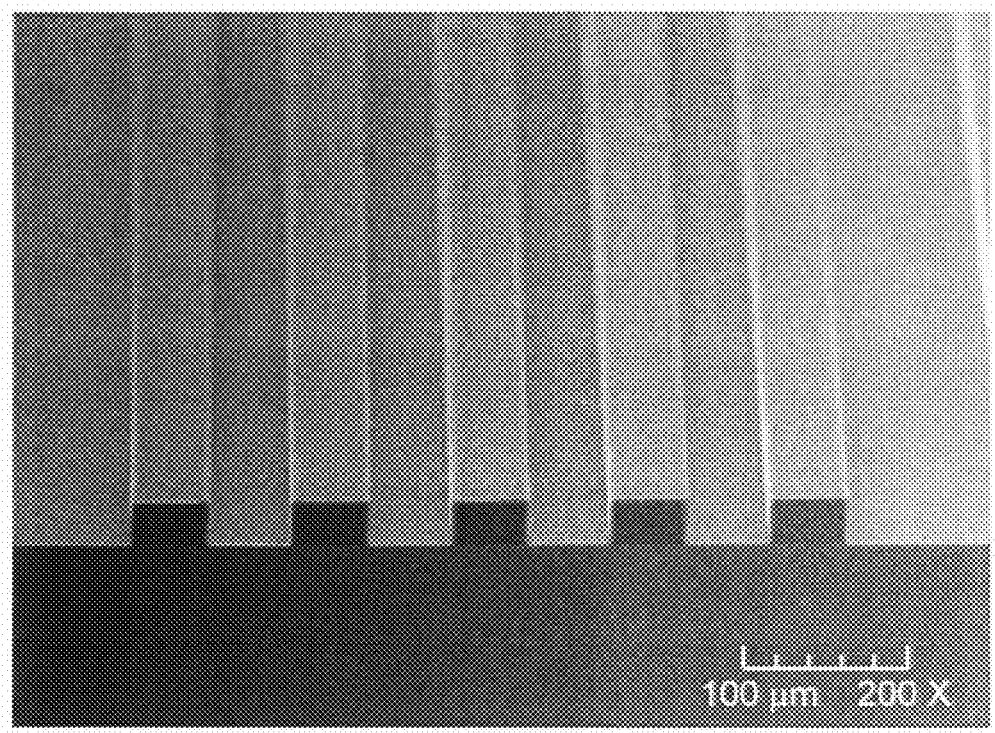
FIG. 14 depict further phototrimmed patterns made from an epoxy-based composition of the present invention.

The above ingredients were combined as described above, printed onto a silicon substrate, and cured as described above. Images from this composition were examined by electron microscopy and shown in FIGS. 7-8.

Example 4

PMGI Composition

A PMGI composition was made by blending the following ingredients as outlined above.

| Component | Amount (wt %) |
|---|---|
| PMGI Resin | 10.99 |
| Surfactant (FluoroN) | 0.01 |
| Solvent 1 (γ-butyrolactone) | 50.7 |
| Solvent 2 (Cyclopentanone) | 32.1 |
| Solvent 3 (1,3 Dioxolane) | 6.2 |

The above ingredients were combined as described above, printed onto a silicon substrate, and cured as described above.

Example 5

Conducting Nanocomposite of Photopatterning Epoxy for Active Matrix Liquid Crystal Displays (AMLCD) and Active Matrix Organic Light Emitting Diode Displays (AMOLED)

This ink jet epoxy composition incorporates nanosized conducting Indium Tin Oxide (ITO) conducting nanocomposite (5-100 nm diameter or monodisperse nanospheres) to ink jet pattern both rigid and flexible conducting transistors in pixels for AMLCD and AMOLED applications. Photo-Trimming is then employed to achieve resolution required for patterning the ITO transistor.

| Component | Amount (wt %) |
|---|---|
| Epoxy SU-8 Resin + 0.1-10 wt % ITO nanopheres dispersed | 29.5 |
| PAG (Cyracure) | 1.48 |
| Surfactant (PF-151N) | 0.1 |
| Solvent 1 (γ-butyrolactone) | 6.9 |
| Solvent 2 (Cyclopentanone) | 62.1 |

The ITO nanospheres (0.1-10 wt %) are dispersed in a solution of 29.5 wt % Epoxy SU-8 resin+62.1 wt % Cyclopentanone. The remainder of the components are serially added and stirred at room temperature 12-24 hours. Thereafter, the whole is filtered to 1 micron or better.

Example 6

Conducting Nanocomposite of Photopatterning Epoxy

Nanocomposite light blocking dielectric film consisting of Titanium Oxide ($TiO_2$) nanospheres, (5-100 nm) dispersed in photo and thermal hardening epoxy for permanent applications, using the general formulation recipe described in Example 5 and substituting TiO2 nanospheres for ITO nanospheres specifies this example.

Example 7

Conducting Nanocomposite of Photopatterning Epoxy

A nanocomposite barrier layer consisting of nanosized silica and/or zeolite compositions (5-100 nm sphere diameter), with photo or thermally hardened epoxy, for use as moisture resistant barrier layer. Using Example 5 as the basic recipe, and substituting nanosized silica and/or zeolite nanocomposite compositions for ITO specifies this example.

Example 8

Conducting Nanocomposite of Photopatterning Epoxy

A nanocomposite antimicrobial, antibacterial film layer consisting of a nanosized silver or silver nanocomposite compound, in 5-100 nm nanospheres or equivalent, with photo or thermally hardened epoxy polymer.

Example 9

Photo-Trimming

The ink jet printed epoxy composition of Example 1 or 2 may be subsequently patterned with UV light through a high resolution lithographic mask. To implement this process, a photo-mask is aligned to the printed area to product these images as outlined above. Two major features of photo-trimming are increased resolution and reduction of scum during processing. Photo-trimming can also be used in a Lift-off process where a printable PMGI compositions are layered with a printed epoxy or novolac formulary to image it and further increase resolution. Results of the photo-trimming process are shown in FIGS. 9-14.

Example 10

Lift Off Processes for Metal Deposition

Figure 15:
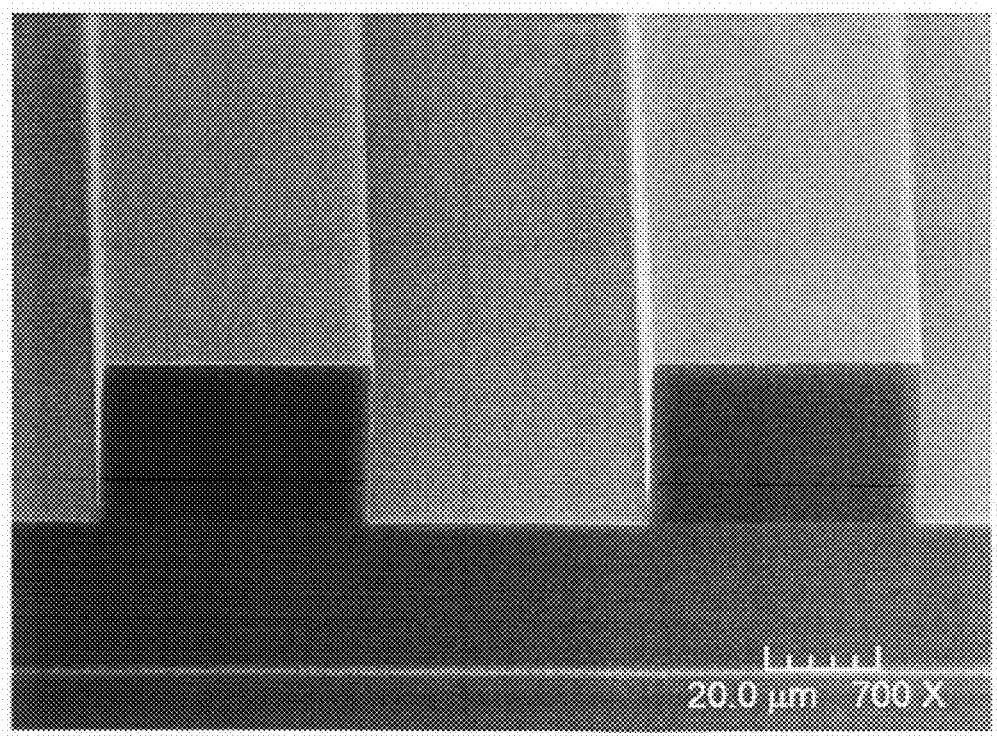
FIG. 15 depict further phototrimmed patterns made from an epoxy-based composition of the present invention.
Figure 16:
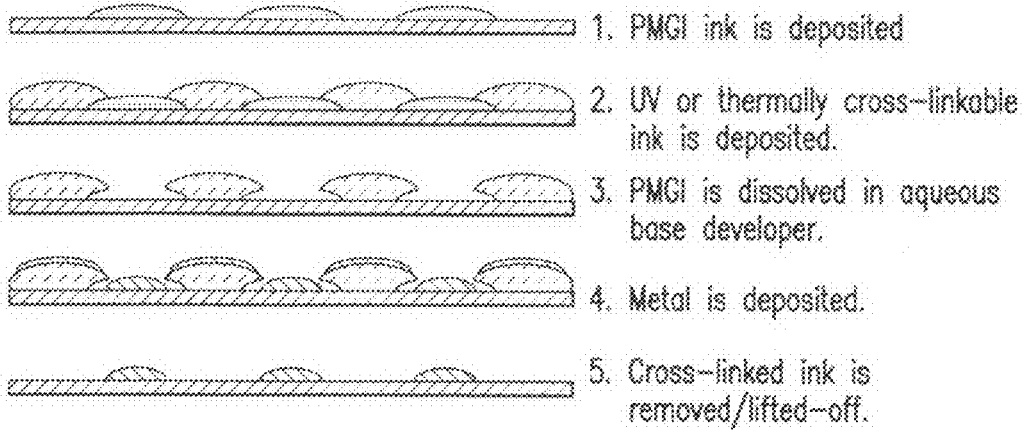
FIG. 16 depicts lift off processes for metal deposition using the compositions and methods of the present invention.
Figure 16:
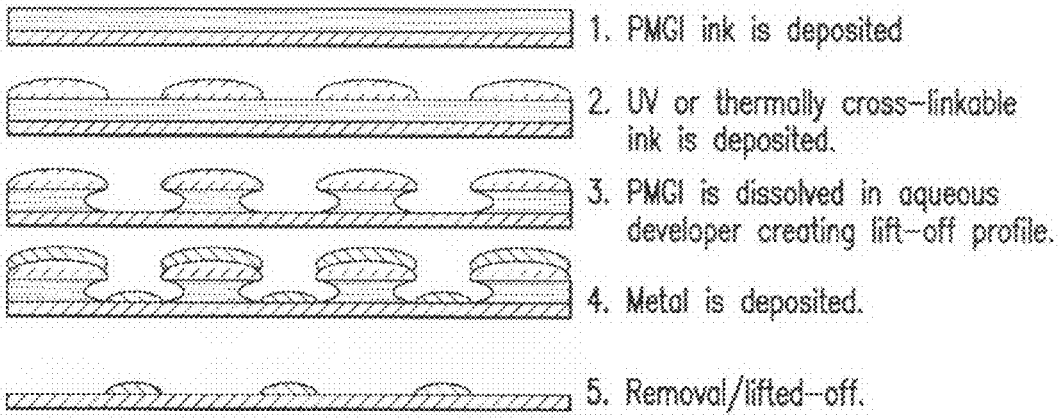
Figure 16:
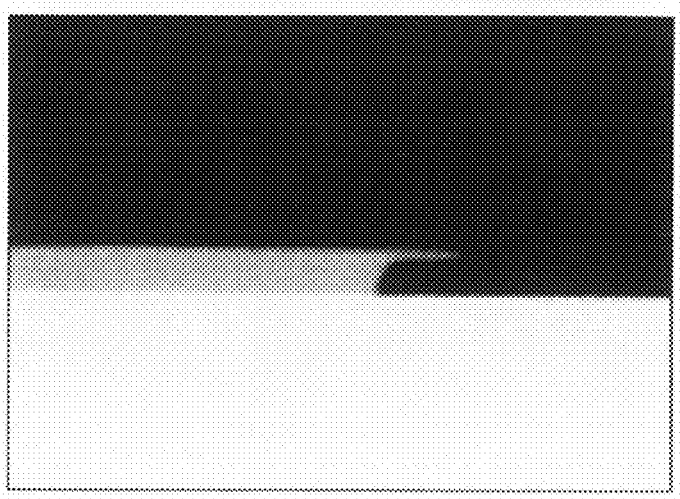

As indicated above, Lift-Off processes can be used for controlled metal deposition in compound semiconductor applications such as photovoltaics, VCELs, transistors. An example of this technique using the compositions and processes of the present invention is shown in FIG. 15.

A micrograph of a Lift-Off profile (FIG. 15, Option 2) was created. The underlayer was made from PMGI Ink printed and cured (Example 4), and cured at 110° C. for 1 min. This product was coated with a top layer comprising an epoxy ink printed and cured (Example 2), and then cured at 110° C. for 1 min. Development time (immersion) was ~1 min in 2.38% TMAH Developer.

What is claimed is:

1. A method of producing a printed pattern on a substrate, comprising the steps of:
    (1) applying a printable composition to a substrate using a piezo-electric printing device, said printable composition consisting essentially of:
    a poly(dimethylglutarimide) polymer;
    a solvent composition comprising (1) a high boiling point solvent having a flash point greater than about 10° C. and a boiling point greater than about 130° C. and (2) a low boiling point solvent having a flash point less than 30° C. and a boiling point less than or equal to 130° C.;
    an optional crosslinker;

an optional acid generator; and
optional additives;

(2) drying said applied composition; and (3) optionally curing said dried composition to produce a printed pattern on a substrate.

2. The method of claim 1, wherein said drying step takes place in the presence of heat.

3. The method of claim 1, wherein said optional curing step comprises phototrimming.

4. The method of claim 1, wherein said poly(dimethylglutarimide) polymer is present in an amount of 0.5 to 15 wt %, based on the total weight of said printable composition.

5. The method of claim 4, wherein said poly(dimethylglutarimide) polymer is present in an amount of 5 to 12 wt %, based on the total weight of said printable composition.

6. The method of claim 1, wherein said solvent composition is present in an amount of 85 to 99.5 wt %, based on the total weight of said printable composition.

7. The method of claim 6, wherein said solvent composition is present in an amount of 88 to 95 wt %, based on the total weight of said printable composition.

8. The method of claim 1, wherein said high boiling point solvent is selected from the group consisting of gamma butyrolactone, ethyl lactate, methyl 2-hydroxyisobutyrate, PGMEA, cyclohexanone, tetrahydrofurfuryl alcohol, propylene carbonate, 2-heptanone, NMP, diacetone alcohol, and combinations thereof.

9. The method of claim 1, wherein said low boiling point solvent is selected from the group consisting of methyl isobutyl ketone, cyclopentanone, 1,3dioxolane, tetrahydrofuran (THF), methyl isopropyl ketone, 2-pentanone, pinacolone, methyl ethyl ketone (MEK), toluene, and combinations thereof.

10. The method of claim 1, wherein said crosslinker is present in an amount not greater than 15 wt %, based on the total weight of said printable composition.

11. The method of claim 10, wherein said crosslinker is present in an amount not greater than 10 wt %, based on the total weight of said printable composition.

12. The method of claim 11, wherein said crosslinker is present in an amount of 2.5 to 9 wt %, based on the total weight of said printable composition.

13. The method of claim 1, wherein said crosslinker is selected from the group consisting of methylated melamine crosslinkers, alkylated mixed ether melamine crosslinkers, tetrakis(methoxymethyl)glycoluril crosslinkers, alkylated mixed ether benzoguanamine crosslinkers, alkylated mixed ether carboxylated benzoguanamine crosslinkers, and combinations thereof.

14. The method of claim 1, wherein said acid generator is present in an amount not greater than 6 wt %, based on the total weight of said printable composition.

15. The method of claim 14, wherein said acid generator is present in an amount not greater than 4 wt %, based on the total weight of said printable composition.

16. The method of claim 15, wherein said acid generator is present in an amount not greater than 3 wt %, based on the total weight of said printable composition.

17. The method of claim 1, wherein said additives are selected from the group consisting of dyes, plasticizers, flexibilizers, surface leveling agents, surface wetting agents, nanoparticles, nanocomposite materials, and combinations thereof.

18. The method of claim 1, wherein said acid generator is an onium salt.

19. The method of claim 18, wherein said onium salt is selected from the group consisting of diaryl-diazonium salts, halonium salts, quaternary ammonium onium salts, phosphonium and arsonium salts, aromatic sulfonium salts, sulfoxonium salts, selenium salts, substituted diphenyl iodonium camphor sulfonate compounds, and combinations thereof.

20. The method of claim 1, wherein said acid generator is selected from the group consisting of sulfonated esters, sulfonyloxy ketones, benzoin tosylate, t-butylphenyl alpha-(p-toluenesulfonyloxy)-acetate, t-butyl alpha-(p-toluenesulfonyloxy)-acetate, nitrobenzyl esters, s-triazine compounds, 1,1-bis[p-chlorophenyl]-2,2,2-trichloroethane (DDT); 1,1-bis[p-methoxyphenyl]-2,2,2-trichloroethane; 1,2,5,6,9,10-hexabromocyclodecane; 1,10-dibromodecane; 1,1-bis[p-chlorophenyl]-2,2-dichloroethane; 4,4-dichloro-2-(trichloromethyl) benzhydrol (Kelthane); hexachlorodimethyl sulfone; 2-chloro-6-(trichloromethyl) pyridine; o,o-diethyl-o-(3,5,6-trichloro-2-pyridyl) phosphorothionate; 1,2,3,4,5,6-hexachlorocyclohexane; N(1,1-bis[p-chlorophenyl]-2,2,2-trichloroethyl)acetamide; tris[2,3-dibromopropyl]isocyanurate; 2,2-bis[p-chlorophenyl]-1,1-dichloroethylene; tris[trichloromethyl]s-triazine; and combinations thereof.

* * * * *